March 4, 1969 R. C. GRABLE ET AL 3,430,835

WIRE BONDING APPARATUS FOR MICROELECTRONIC COMPONENTS

Filed June 7, 1966

INVENTORS
Ronald C. Grable
and Hans E. Patzer
BY
Gordon K. Lister
ATTORNEY 3,430,835

WIRE BONDING APPARATUS FOR MICROELECTRONIC COMPONENTS

Ronald C. Grable, Mountain View, Calif., and Hans E. Patzer, Ellicott City, Md., assignors to Westinghouse Electric Corporation, Pittsburgh, Pa., a corporation of Pennsylvania Filed June 7, 1966, Ser. No. 555,873
U.S. Cl. 228—4 5 Claims
Int. Cl. B23k *19/00;* B21f *15/10;* H01r *43/02*

ABSTRACT OF THE DISCLOSURE

Thermocompression bonding with avoidance of a tail of excess wire at the bond is provided by apparatus including means responsive to the motion of the capillary from the bonding surface to grasp the wire and sever it at the bond.

This application has to do with a method and apparatus for wire bonding and, particularly, to improved wire bonding in the fabrication of microelectronic components.

In the fabrication of microelectronic components such as semiconductor integrated circuits, it is necessary to make a relatively large number of wire bonds to a small device. Typically, the technique previously employed has been to join a wire to a metal layer on the component itself by thermocompression bonding using a capillary member through which the wire is fed and by which it may be heated and pressure applied at the point of bonding. After that bond is formed, the capillary is moved to the lead or post of the component that extends exterior to the package and a stitch bond is there formed after which the capillary is moved vertically and a flame swept across the wire separating it and forming a ball below the capillary suitable for use in the next bonding operation.

The portion of the separated wire that remains connected to the lead, called a tail, must be removed because it could produce a short in the device or otherwise interfere with operation. This has been done by manually seizing the wire with tweezers and pulling it to separate the wire at the stitch bond where it has reduced cross-section. This operation, called "tail pulling," must be done under a microscope and is very cumbersome and difficult to perform reliably. In pulling the wire and attempting to separate it at the stitch bond, it is quite possible that it may be separated from the device itself and result in an inoperative produce. It is also desirable to avoid the use of unnecessary wire.

It is, therefore, an object of the present invention to provide an improved method and apparatus for bonding wire, particularly on microelectronic components, whereby the necessity of tail pulling can be avoided.

Another object is to provide an improved method of bonding wire to microelectronic components that insures greater reliability of the resulting product at lower labor cost.

The present invention, briefly, achieves the above-mentioned and additional objects and advantages in a method that includes removing the capillary, after a bond is made such as at the lead of a component, from the bonding point and pulling the wire to sever it at the bonding point before the wire is severed elsewhere, and then applying heat to the severed end of the wire to form a ball of metal suitable for forming a subsequent bond. In accordance with other features of the invention, means are provided so that the movement of the capillary a predetermined distance actuates a gripping mechanism that provides the pulling of the wire to sever it at the bonding point.

The above-mentioned and additional objects and advantages of the present invention will be better understood by referring to the following description taken with the accompanying drawing, wherein.

Figure 1:
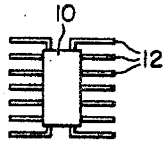
FIGURE 1 is a plan view of a microelectronic component with which the method of this invention may be advantageously used.

Referring now to FIGURE 1, there is shown a microelectronic component such as a semiconductor integrated circuit in a flat package 10. The figure is drawn to actual size for a package having measured dimensions of ¼ by ½ inch. As a typical example, fourteen leads 12 extend from such a package. Of course other sizes of packages, including smaller ones, with other lead configurations and numbers of leads are sometimes employed. FIGURE 1 serves to show the nature of the size of component with which the present invention is most advantageously practiced and the nature of the problems that are required to be solved. In bonding as many leads are as shown to the internal structure, it is clear that a high degree of precision is required because of the small size of the leads as well as the internal component bonding areas and the closeness with which they are spaced.

Figure 2:
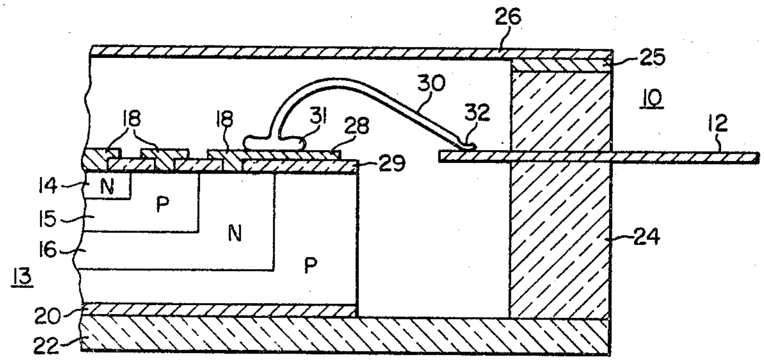
FIG. 2 is an enlarged partial sectional view of a microelectronic component like that of FIGURE 1 illustrating the structure to be formed by the method of this invention.

FIG. 2 illustrates part of an integrated circuit 13 that merely for the purpose of example has in one portion a transistor structure including emitter, base and collector regions 14, 15 and 16 with ohmic contacts 18 to each of the regions. In this example, the integrated circuit 13 is joined by a conductive layer 20 to a base member 22 that may be of ceramic for example and a wall 24 of an insulating material extends upwardly from the base member and has sealed in it the leads 12 of the device including that shown which is intended to serve as a collector lead for the integrated circuit structure. The component package is sealed by a conductive lid member 26 joined to the glass wall by a metal frame 25. It will be understood that this package configuration is merely shown for purposes of example and many varieties may be used. A conductive layer 28 is joined with the collector contact 18 on top of insulating layer 29 and serves as a bonding pad for a wire 30 extending from it to one of the package leads.

Ordinarily the package leads have typical widths of about 5 mils with a center-to-center spacing of about 20 mils and the wire used is gold wire of one mil diameter.

As shown in FIG. 2, the portion 31 of the wire 30 on the bonding pad 28 of the integrated circuit has a flattened bulbular shape and the formation of such a bond is sometimes called nail head bonding or ball bonding. The bond is formed by the application of heat and pressure by means of a capillary through which the wire passes, a suitable ball having been formed on the wire first for the capillary to bear against on the bonding pad. The bond to the bonding pad is formed with a free end of wire following which the capillary and additional wire is moved or carried to the lead post and a stitch bond 32 is formed by bearing down with the capillary and heating the wire.

Figure 3:
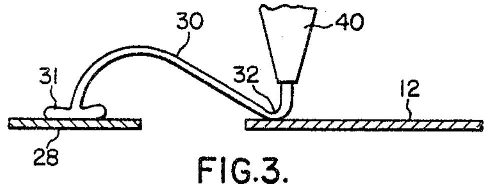
FIG. 3 is a schematic view in cross-section of the fabrication of a component either in accordance with the present invention or with the prior art.

FIG. 3 generally shows the nature of the bond formation at the post 12 by use of a capillary 40, through which the wire is continuously fed, having been brought into contact with the wire on the lead 12 and forming the necessary stitch bond 32.

The stitch bond forming operation itself does not sever the wire. A separate operation must be performed for that purpose.

Figure 4:
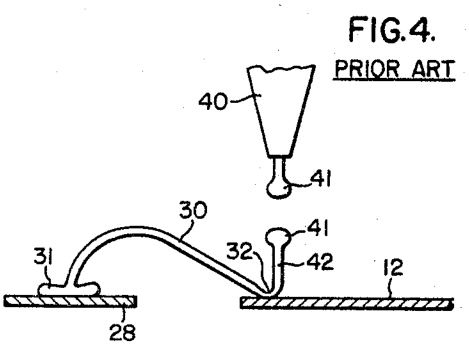
FIG. 4. PRIOR ART
FIG. 4 illustrates the structure of FIG. 3 after the wire bonding operation has been carried out in accordance with the prior art.

FIG. 4 illustrates the practice of the prior art in separating the wire after the bond at the lead 12 was formed. The capillary 40 would be raised away from the lead to permit a flame to be applied to the wire for melting and separating it and forming a ball 41 at each of the severed ends. The ball 41 extending from the wire below the capillary is suitable for performing the next ball bonding operation to one of the component bonding pads.

The portion of wire 42 that remains joined to the lead 12 is mere excess and must be removed because it will naturally tend to fall to a horizontal position and would be likely to short out a pair of leads or fall onto the component and result in electrical failure. This portion 42 of wire has been termed in the art a "tail" and the operation by which it is removed has been called "tail pulling." The manner in which this is done has been simply after removing the capillary 40 for the operator to grasp the tail 42 with a pair of tweezers and pull to separate the bond at the lead. Considering the size of components usually formed this way, this operation must be performed under a microscope and is slow and tedious and relatively unreliable because any inadequacy in the stitch bond 32 may not be apparent to the eye of the operator and pulling the "tail" may, because of the short distances involved, not separate the wire at the lead but remove the wire from the lead entirely and also pull off the bond 31 at the bonding pad requiring repetition of the bonding operation. The wire in the tail itself was essentially wasted also and overall this operation added considerable expense to the wire bonding operation.

Figure 5:
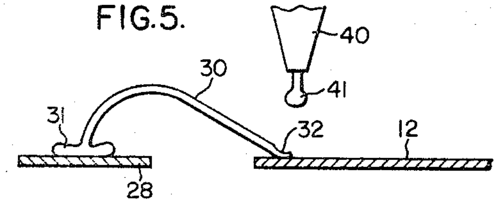
FIG. 5 illustrates the structure of FIG. 3 after the wire bonding operation has been carried out in accordance with this invention.

FIG. 5 illustrates that in the practice of the present invention tail pulling is avoided because no tail is formed. After forming the stitch bond 32 on the lead, the capillary is removed a prescribed distance at which point the wire 30 is pulled, preferably and most conveniently by mechanical means, to sever it at the bonding point 32 so that no tail is formed. This is performed without requiring the wire to be severed elsewhere.

Heat is then applied to the severed end of the wire extending below the capillary to form a ball 41 of metal suitable for performing a subsequent bond. Thus, it is seen that there is no requirement for performing a tail pulling operation. If for any reason the stitch bond 32 fails to hold and the wire does not sever, the restricted motion of the capillary will avoid pulling the wire off the bonding pad 28.

Figure 6:
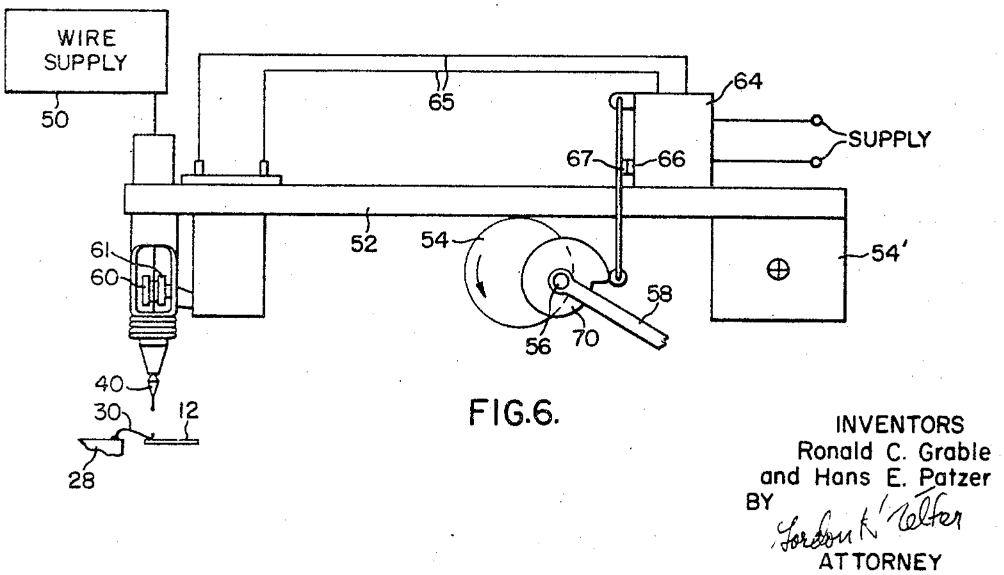
FIG. 6 illustrates apparatus in accordance with this invention.

FIG. 6 further illustrates apparatus embodying the present invention. Apart from the mechanism for severing the wire, the apparatus includes capillary 40 through which wire is fed from wire supply 50. The capillary has in it a heater coil for resistance heating. The capillary 40 is supported on a beam 52 whose other end is fixed to a pivot block 54. The motion of the beam 52, and hence that of the capillary 40, is actuated by eccentric bearing 54, a cylinder with an off-center shaft 56. The shaft 56 has an arm 58, partially shown, that the operator manipulates. The arm 58 may suitably be part of a Z arm mechanism. In operation, a counterclockwise rotation of shaft 56, and also bearing 54, causes beam 52 to be lowered and the capillary to come in contact with a workpiece 38. The apparatus also includes a hydrogen flame, not shown, for producing a ball at the wire's end as desired by the operator.

In accordance with this invention, the combination also includes a pair of fingers 60 and 61 on opposite sides of the wire path. These may be of metal with rubber inserts, capable of withstanding about 500° F., so as not to deform the wire. One of the fingers 60 is movable so that when actuated it is brought near enough to the fixed finger 61 to grip the wire. The fingers 60 and 61 are essentially similar to relay contacts, although they do not meet to complete a circuit. They are electrically connected to a microswitch 64 by leads 65. The microswitch 64 is connected to a power supply. Microswitch 64 has fixed and movable contacts 66 and 67 that are normally open. On the shaft 56 is mounted a cam 70 that follows the motion of bearing 54 and closes the microswitch contacts 66 and 67, as shown, when the capillary is raised a predetermined distance. This closes the fingers 60 and 61 causing them to grip and, with only a slight amount of additional motion, pull the wire. The microswitch is reopened when the capillary is lowered. The cam 70 can be adjusted to control the height at which the wire is pulled.

The description herein has disclosed the basic elements of apparatus in accordance with this invention that has been successfully made and used. Additional features and constructional detail can be provided by those skilled in the art. The apparatus of FIG. 6 is, of course, merely one example of an electromechanical system suitable in practicing the invention. Other electromechanical and mechanical systems may be devised.

While the present invention has been shown and described in a few forms only, it will be apparent that various modifications may be made without departing from the spirit and scope thereof.

What is claimed is:

1. In apparatus for wire bonding having a capillary through which wire is fed and means to engage said capillary on a surface with the application of heat and pressure to form a bond, the improvement comprising: means responsive to the motion of the capillary away from a bond to grasp the wire and sever it at the bond so as to avoid the presence of excess wire at the bond without requiring the wire to be severed elsewhere, said means responsive to the motion of the capillary comprising first and second electrically closeable fingers disposed on opposite sides of the wire path and electrically coupled to a switch having a fixed and a movable contact with cam means to bring said movable contact in contact with said fixed contact upon a predetermined motion of the capillary.

2. Thermocompression wire bonding apparatus comprising: a wire supply; a capillary through which wire is fed from said wire supply; a beam supporting said capillary, said beam being fixed to a pivot block at a position remote from said capillary; means controllable to move said beam about said pivot block resulting in initial motion of said capillary substantially only perpendicular with respect to a bonding surface; means responsive to the perpendicular motion of said capillary to grasp the wire and sever it at a bond.

3. The subject matter of claim 2 wherein: said means to move said beam comprises an eccentric bearing controllably rotatable about an off-center axis.

4. The subject matter of claim 2 wherein: said means responsive to the motion of the capillary comprises first and second electrically closeable fingers disposed on opposite sides of the wire path and electrically coupled to a switch having a pair of contacts with cam means to close said contacts upon a predetermined motion of the capillary.

5. The subject matter of claim 2 wherein: said means to move said beam comprises an eccentric bearing controllably rotatable about an off-center axis, and said means responsive to the motion of the capillary comprises first and second electrically closeable fingers disposed on opposite sides of the wire path and electrically coupled to a switch having a pair of contacts with cam means to close said contacts upon a predetermined motion of the capillary.

References Cited

UNITED STATES PATENTS

| | | | |
|---|---|---|---|
| 3,083,595 | 4/1963 | Frank et al. | |
| 3,125,803 | 3/1964 | Rich | 29—472.9 X |
| 3,125,906 | 3/1964 | Johnson | 29—497.5 X |
| 3,216,640 | 11/1965 | Szasz. | |
| 3,286,340 | 11/1966 | Kritzler et al. | 29—471.1 |

JOHN F. CAMPBELL, *Primary Examiner.*

J. L. CLINE, *Assistant Examiner.*

U.S. Cl. X.R.

29—13, 497.5, 591; 228—19